United States Patent [19]

Curti

[11] Patent Number: 5,071,305
[45] Date of Patent: Dec. 10, 1991

[54] DEVICE FOR SUPPORTING AND TURNING OVER BOARD-LIKE OBJECTS, TO BE TRANSPORTED THROUGH A CONTINUOUS CIRCULATION OVEN

[76] Inventor: Ezio Curti, Strada Padana Superiore 57/59, Milan/Cernusco s/Naviglio, Italy

[21] Appl. No.: 389,355

[22] Filed: Aug. 3, 1989

[51] Int. Cl.$^5$ .............................................. B65G 17/00
[52] U.S. Cl. ............................... 414/157; 198/803.13; 34/208
[58] Field of Search ............... 414/150, 157, 172, 173, 414/187, 196; 198/484.1, 803.13; 34/207, 208

[56] References Cited

U.S. PATENT DOCUMENTS

| | | | |
|---|---|---|---|
| 1,810,859 | 6/1931 | Thurmer | 198/803.13 X |
| 2,237,659 | 4/1941 | Edwards | 414/157 X |
| 2,316,177 | 4/1943 | Melzer | 198/803.13 |
| 2,644,473 | 7/1953 | Fox et al. | 198/803.13 X |
| 2,706,552 | 4/1955 | Key | 198/803.13 |

Primary Examiner—David A. Bucci
Attorney, Agent, or Firm—Kirschstein, Ottinger, Israel & Schiffmiller

[57] ABSTRACT

An arrangement for transporting printed circuit boards along a path through a dryer operative for drying wet ink applied to at least one of the surfaces of each board, includes an endless conveyor for successively conveying the boards along a vertical ascent portion of the path, a horizontal portion of the path, and a vertical descent portion of the path. A plurality of supports for holding respective boards are mounted for joint movement on, and are successively arranged along, the conveyor. Each support includes a plurality of arms which only engage side edges of a respective board to prevent smearing of the ink during conveyance, and particularly between the ascent and horizontal path portions, as well as between the horizontal and descent path portions.

8 Claims, 4 Drawing Sheets

DEVICE FOR SUPPORTING AND TURNING OVER BOARD-LIKE OBJECTS, TO BE TRANSPORTED THROUGH A CONTINUOUS CIRCULATION OVEN

BACKGROUND OF THE INVENTION

1. Field of the Invention

The present invention relates to a device for supporting and turning over board-like objects, covered on at least one side with a substance, to be dried in a continuous-circulation oven. The invention relates in particular to a device which allows the efficient drying of support boards for printed circuits.

2. Description of Related Art

It is known from the prior art that the support boards which must receive printed electronic circuits are provided with the design of the future printed circuit (layout), for example by means of photographic processes or with the aid of printing processes mainly silk-screen printing processes.

After applying onto the support board the corresponding design of the electronic circuit, the layer of ink of the design or layout must be subjected to a delicate drying procedure, enabling the board to be subjected subsequently to further operating stages, known from the art.

The time required to dry the layer of ink applied by means of the silk-screen process lasts several minutes and, obviously, during this period, the silk-screen printed boards must be treated with maximum care, precisely to prevent the fresh layer of ink, which requires the time mentioned in order to dry completely, from being irreparably damaged.

Therefore, subsequent to the silk-screen printing machine used to make printed circuits, hitherto it was usual to remove manually the silk-screen printed support boards, arranging them delicately and individually on trolleys having various surfaces located one above the other for receiving the boards. Then, these trolleys were introduced into a drying chamber, in which they remained for a certain period of time, so as to allow drying of the ink applied previously by means of the silk-screen process on at least one side of the support board.

It can be easily understood that this procedure interrupted in a completely undesirable manner the automated process for production of the support boards for electronic circuits Furthermore, this procedure required considerable manpower and rejects could not be avoided.

It would, of course, be conceivable to construct a drying oven through which the support boards to be dried would pass in the longitudinal direction but, since the drying stage requires a considerable amount of time, it is obvious that this oven would have to have dimensions which would no longer be acceptable from a technical and economic point of view.

SUMMARY OF THE INVENTION

It is therefore the object of the present invention to overcome the drawbacks belonging to the prior art and devise a device for supporting boards, covered with printing ink or in any case with a pasty-liquid layer on at least one side, so as to transport them safely through a continuous-circulation oven, avoiding in particular, in the event of turning over, on account of a variation in the direction of forward movement of the board support devices, the possibility of damage to the layer of ink not yet dried owing to it resting on an adjacent support device.

The invention relates moreover to an oven, provided with such devices, suitable for being inserted in a continuous automatic line for the production of support boards for electronic circuits.

According to the invention, this object is achieved by means of a support device consisting of parallel arms projecting from a support plate connected to moving chains passing through a continuous-circulation oven, wherein the support arms are in the shape of an X, wherein the ends of the arms directed towards the support plate are integral with the latter and wherein, in the region of the ends of the arms connected to the support plate, with each X-shaped support there is associated a bracket in the shape of a C, one end of which is integral with the support plate and forms an abutment as well as an inclined surface, which extends towards the free end of the bracket.

With support means made in this manner, it becomes possible to use a continuous-circulation oven provided with a large number of support groups which, with parallel chain sections, are conveyed along ascending vertical paths, horizontal paths, as well as along descending vertical paths, safely moving the supports as well as the parts through a continuous-operation oven of essentially vertical construction.

Further details of the invention may be obtained from the following description, from the subclaims, as well as from the accompanying drawings.

BRIEF DESCRIPTION OF THE DRAWINGS

The subject, devised according to the present invention, will now be described in greater detail by means of an embodiment provided solely by way of example and illustrated in the accompanying drawings in which.

DETAILED DESCRIPTION OF THE PREFERRED EMBODIMENT

Figure 1:
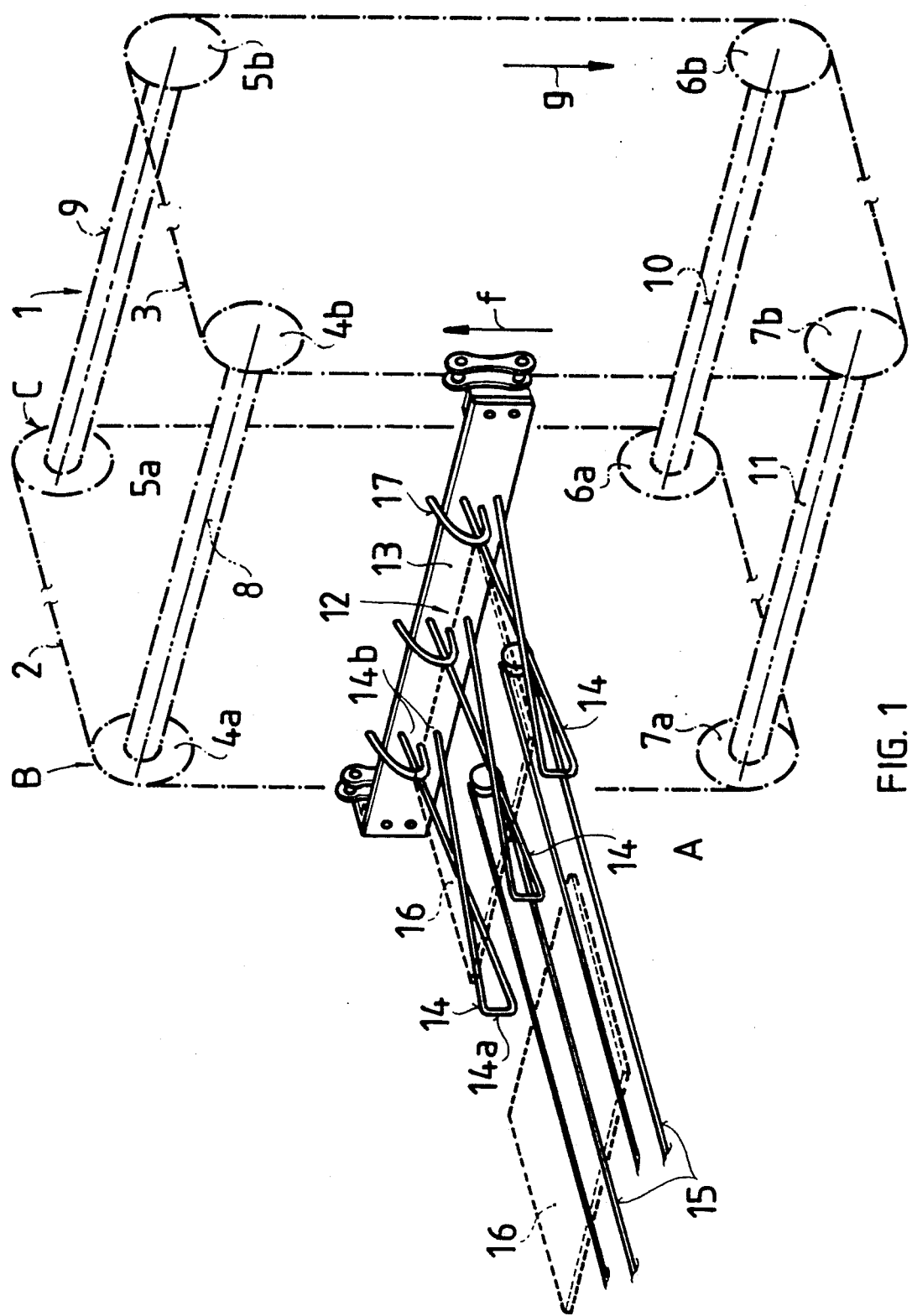
FIG. 1 shows in diagrammatic form a support group connected to two parallel chain sections and passing through an oven not shown.

As can be seen in FIG. 1, the invention is used in a continuous-circulation oven, denoted in its entirety by 1, but not illustrated in detail. Inside the drying compartment of the oven 1, there are provided two rings of chains 2 and 3, arranged in parallel.

The chains 2 and 3 are guided around drive wheels 4a, 5a, 6a, 7a and 4b, 5b, 6b and 7b, respectively. The drive wheels are connected together by means of actuating shafts 8, 9 10 and 11. One of the drive wheels is operationally connected to an actuating motor (not shown).

In principle, ovens of this kind are known and enable a plurality of support devices or groups 12, connected to the chains 2 and 3, to be transported, in the direction indicated by the arrow f.

Each support group 12, firmly connected to the chains 2 and 3, consists for example of a support plate 13, from which support arms 14 project, arranged parallel and perpendicularly relative to the support plate 13.

In the region of the entry opening of the oven, denoted by A, between the arms 14 there penetrate supply belts 15 which have the purpose of supplying the support panels or boards 16 for the future electronic circuits to the support arms 14 of the corresponding support device 12.

Actuation of the support groups 12 and also of the supply belts 15 may occur either intermittently or continuously, depending on the overall operation of the entire silk-screen printing installation provided upstream.

As can be seen from the figures, the arms 14 are advantageously made of metallic filiform material. The metal wire is folded in an entirely characteristic manner in the shape of an X.

Advantageously, the metal wire is covered with an antiadhesive material.

Advantageously, the support arms may also be made of sheet metal or in the form of a cast piece.

The free end 14a of each arm 14 folded in an X-shape is closed, while the ends 14b of the arm 14 directed towards the support plate 13 are open so as to allow insertion and fixing of these ends 14b, for example in suitable holes formed in the support plate 13. Here, the ends 14b are advantageously fixed locally, for example are secured with the aid of threaded nuts or equivalent means.

Obviously, the arms 14 may also be made of thin sheet metal, cut so as to give the arms 14 their particular X shape.

In the immediate vicinity, laterally with respect to each support arm 14, between its ends 14b, a C-shaped bracket 17 is fixed onto the plate 13.

One end of the bracket 17 is firmly connected to the plate 13 so as to extend in the form of an inclined surface and also so as to project with its free end slightly beyond the plate 13. Said bracket 17 forms a stop and abutment means for the panel 16 supplied and, at the same time, forms an inclined surface which acts as a slide for the panel 16, inviting said panel 16 to slide into a predetermined position during the turning-over movement from one arm 14 to the adjacent arm 14.

Figure 1A:
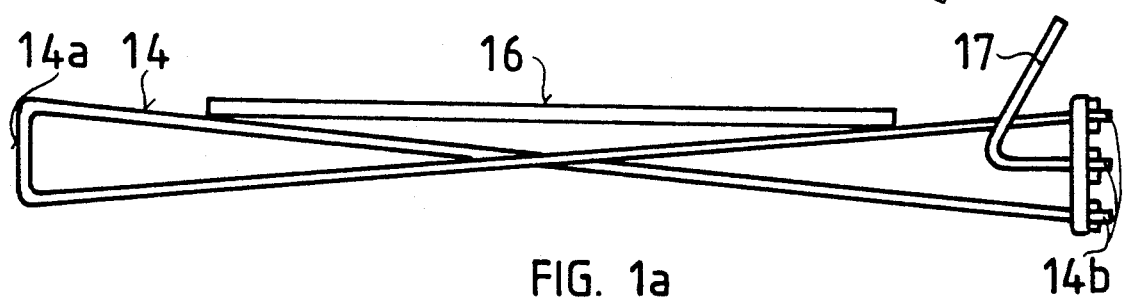
FIG. 1a shows a side view of the detail of a support arm devised, according to the invention.

Positioning of the panel 16 on the X-shaped arm 14, as well as positioning with respect to the bracket 17, is illustrated more clearly in FIG. 1a.

When the device 12 together with the arms 14 is raised, the corresponding support board 16 containing the printed circuit design is removed from the belts 15. Then, the board 16 is positioned on the arms 14, as illustrated in FIGS. 1 and 1a. In this position, as will be noted, the board 16 rests exclusively with its bottom edges on the rods which form the X-shaped arms 14. It should be noted that, in this position, the board 16 rests freely and therefore its .-bottom surface does not come into contact at all with the support arms 14.

As can be seen from the illustrated figures, the arms 14 have a special X shape which define inclined sections and, therefore, the arms 14 are able to receive the panels 16 on both sides, without the arms 14 coming into contact with the ink-covered surfaces to be dried.

This becomes clear from referring to FIGS. 2 and 3, 4 and 5.

Figure 2:
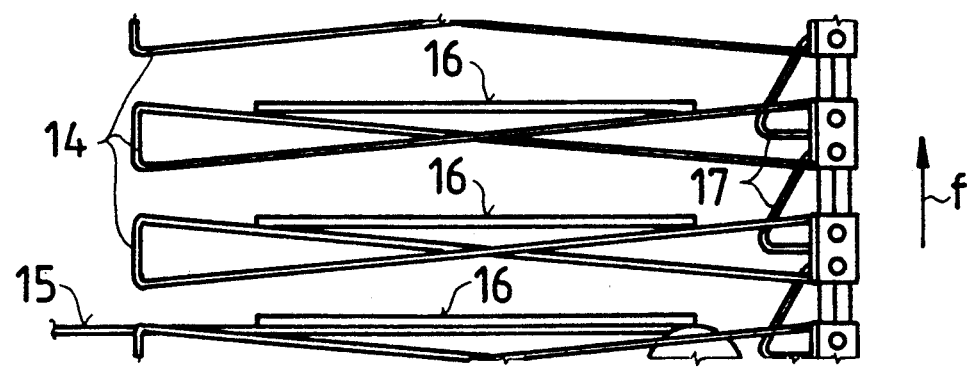
FIG. 2 shows in diagrammatic form the entry side of the oven, with a series of support arms receiving the boards to be dried.

The silk-screen printed panels 16 supplied by the belts 15, as illustrated in FIG. 2, are lifted from the belts 15 by means of the arms 14, since the latter are moved upwards, via the chains 2 and 3, in the direction indicated by the arrow f.

The boards 16 rest on the inclined sections of the arms 14 only with their side edges and, therefore, the printed surface receiving the fresh ink will not be damaged.

Figure 3:
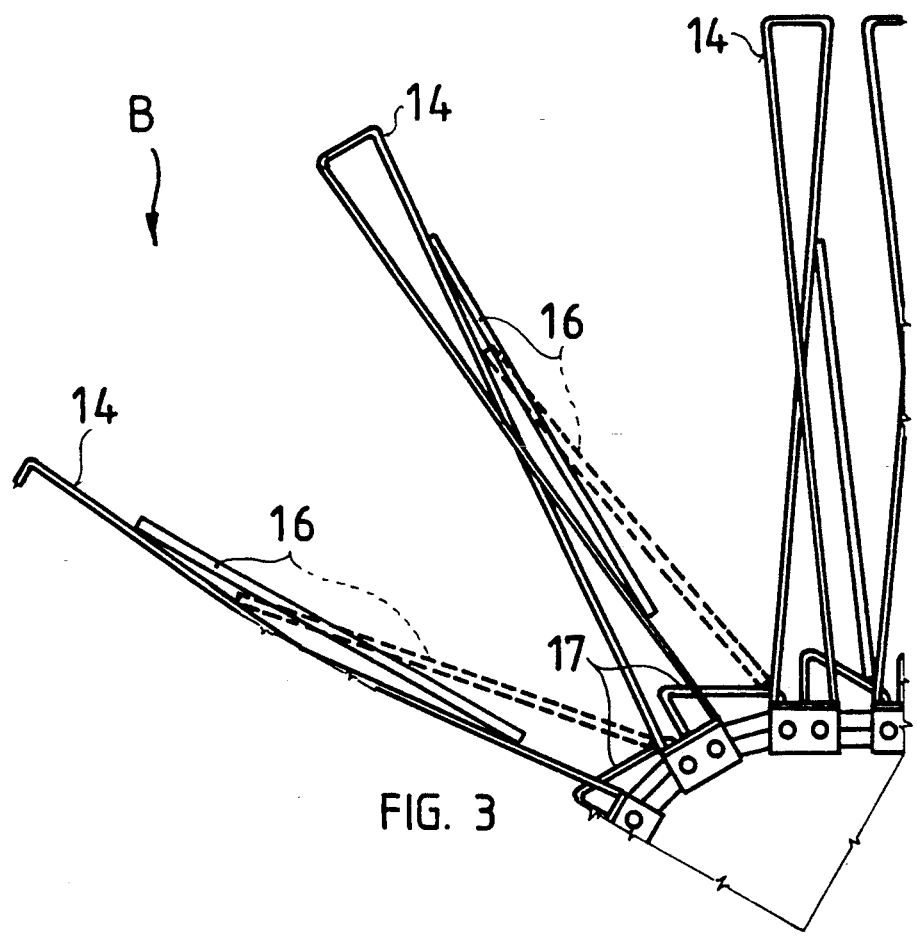
FIG. 3 shows the support arms with the corresponding boards during the transition from the vertical ascending movement to the section of horizontal movement.

In the zone B of the oven, shown in FIG. 1, and as illustrated in detail in FIG. 3, the support arms 14, from a horizontal position, start to tilt, so as to assume a vertical position During this movement, the board 16 starts to slide on the arms 14 towards the bracket 17, the inclined surface of which, directed towards the next arm 14, acts such that the panel gradually slides with its bottom end, as shown in broken lines, towards the base of the arm 14 in front. When the arms 14, passing along the section B-C, are in a vertical position, it may happen that, during the section B-C, the panel 16 remains with its bottom edge resting against the support arm 14 in front, while its top end still rests against the following arm 14 (in the direction of forward movement), or, the support panel 16 might turn over, so as to rest with its edges against the arm 14 in front.

However, in all the positions, the support arms 14 never come into contact with the printed surface of the panel 16, but exclusively with the edges of the panel 16, not damaging the layer of fresh ink.

Figure 4:
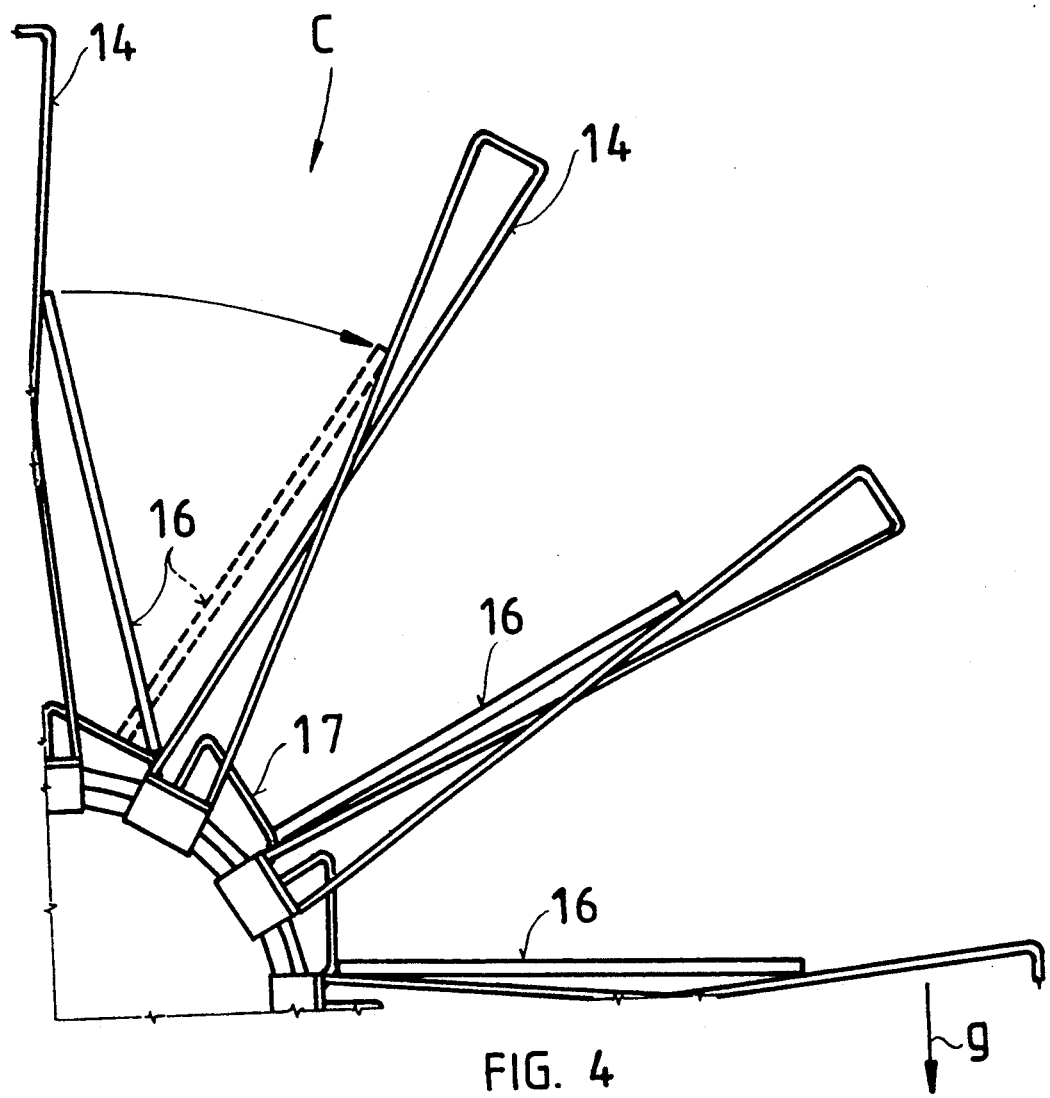
FIG. 4 shows the support arms during the transition from the horizontal section to the section of vertical downward movement.
Figure 5:
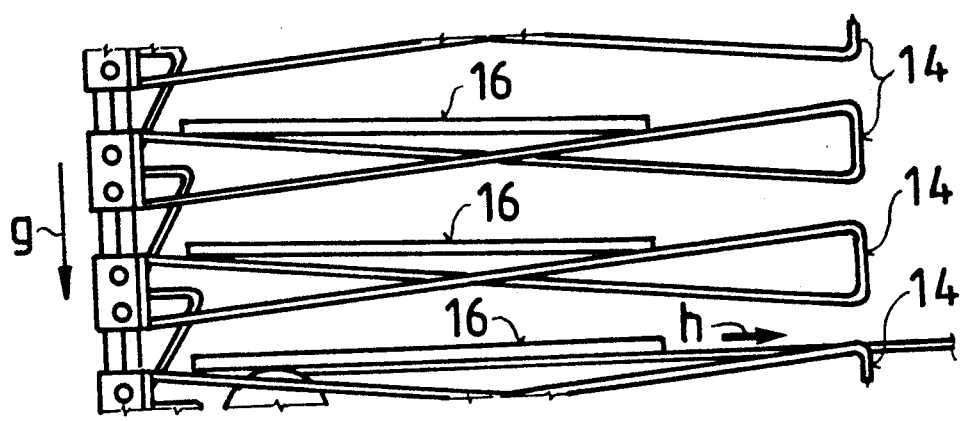
FIG. 5 shows the arms when they reach the unloading zone for the dried board.

When the arm group 14 in position C, as shown in FIG. 4, starts the turning-over movement, such that the arms begin the downward movement, in the direction indicated by the arrow g, the board 16 still resting on the brackets 17 is turned over completely, subsequently resting with its edges on the X-shaped arm 14 in front. Subsequently, the panel will position itself on the arms 14, as indicated in FIG. 5, but always such that the panel 16 rests solely and exclusively with its edges on the X-shaped support arms. During the downward movement, in the direction indicated by the arrow g, the arms automatically deposit the panels 16 on the belts 18 which unload the panels (now dried and no longer able to be damaged) in the direction of the arrow h.

Figure 6:
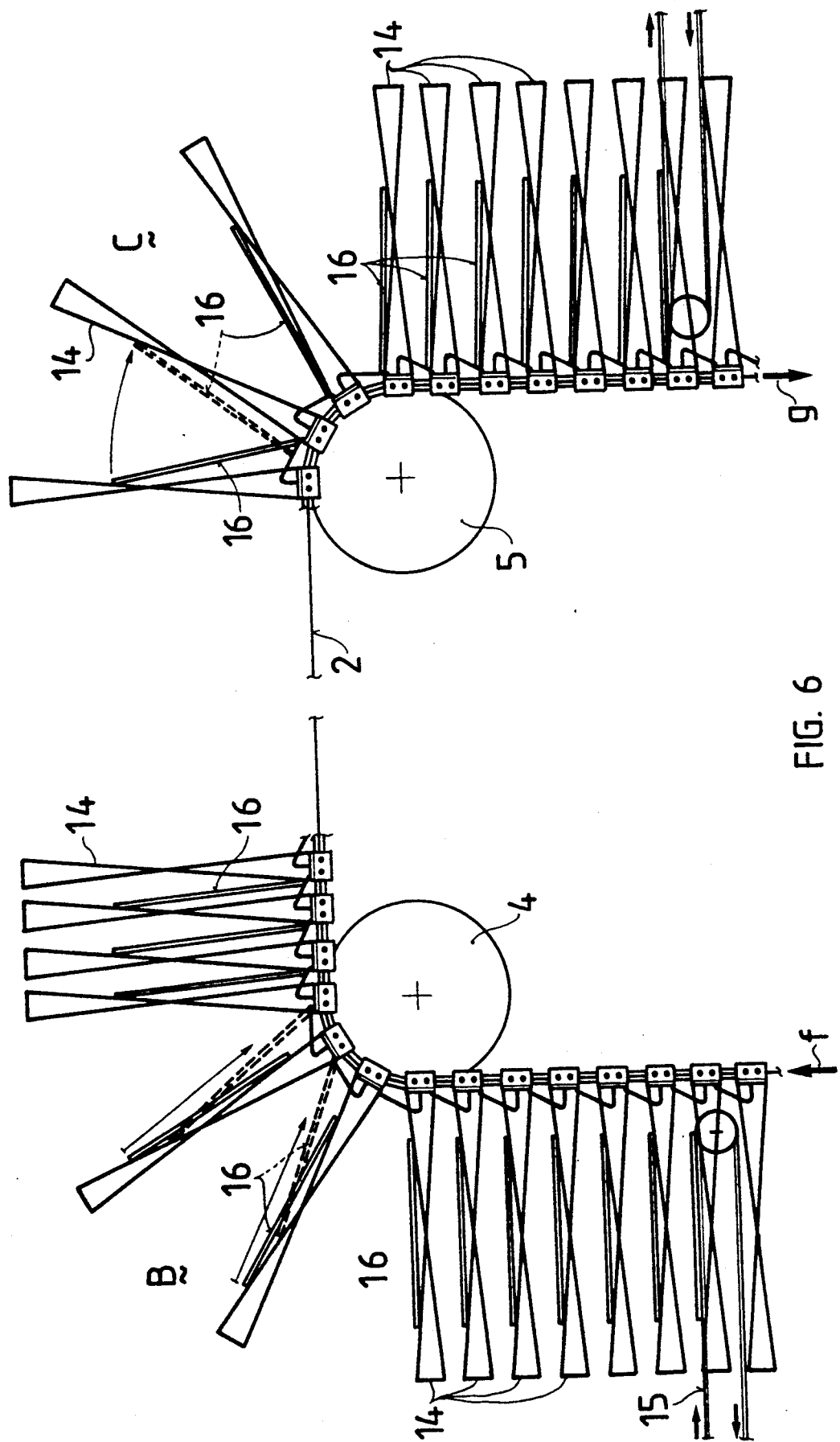
FIG. 6 shows a side view of the top part (B-C) of the known conveyor and of the support groups.

The mode of operation of the means described hitherto may also be seen from FIG. 6 which clearly shows the various stages of movement of the support arms 14 and also of the panels 16.

I claim:

1. An arrangement for transporting boards having generally planar, opposite, board surfaces and side edges along a path through a dryer operative for drying a wet substance applied to at least one of said board surfaces, said arrangement comprising:
   (a) supply means for successively feeding the boards, one after another, to the dryer;
   (b) endless conveyor means in the dryer for successively conveying the boards fed from the supply means along a vertical ascent portion of the path, a horizontal portion of the path, and a vertical descent portion of the path;
   (c) a plurality of support means mounted for joint movement on, and successively arranged along, the conveyor means, each support means being operative for supportably holding respective boards during conveyance along said path portions and including a generally planar base plate and a plurality of arms extending away from the base plate, each arm having a pair of elongated inclined section crossing each other in an X-shaped configuration and operative for supportably engaging only the side edges of a respective board, each support means further including a stop for abuttingly engaging a side edge of a respective board and an inclined ramp along which the side edge of the respective board slides during conveyance between the ascent and horizontal path portions and during conveyance between the horizontal and descent path portions; and (d) delivery means for successively discharging the boards, one after another, from the dryer.

2. The arrangement according to claim 1, wherein the endless conveyor means includes a pair of annular chains spaced apart of each other; and wherein each base plate extends between, and is connected to, the chains.

3. The arrangement according to claim 1, wherein each pair of elongated inclined sections have outer ends interconnected to each other, and inner ends connected to the base plate.

4. The arrangement according to claim 1, wherein each support means includes three arms.

5. The arrangement according to claim 1, wherein each inclined section is a rod.

6. The arrangement according to claim 1, wherein each inclined section is coated with an antiadhesive coating.

7. The arrangement according to claim 1, wherein the stop and the inclined ramp of each support means are integral and together constitute a generally C-shaped bracket having an inner end connected to the base plate, and an outer free end remote from the base plate.

8. The arrangement according to claim 1, wherein the boards are printed circuit boards, and wherein the wet substance is an ink applied to said at least one board surface in a predetermined electrical circuit layout.

* * * * *